(12) United States Patent
Carter et al.

(10) Patent No.: US 7,915,122 B2
(45) Date of Patent: Mar. 29, 2011

(54) SELF-ALIGNED CELL INTEGRATION SCHEME

(75) Inventors: Richard J. Carter, Vancouver, WA (US); Hemanshu D. Bhatt, Vancouver, WA (US); Shiqun Gu, Vancouver, WA (US); Peter A. Burke, Portland, OR (US); James R. B. Elmer, Vancouver, WA (US); Sey-Shing Sun, Portland, OR (US); Byung-Sung Kwak, Portland, OR (US); Verne Hornback, Camas, WA (US)

(73) Assignee: Nantero, Inc., Woburn, MA (US)

( * ) Notice: Subject to any disclaimer, the term of this patent is extended or adjusted under 35 U.S.C. 154(b) by 684 days.

(21) Appl. No.: 11/312,849

(22) Filed: Dec. 20, 2005

(65) Prior Publication Data

US 2006/0281256 A1    Dec. 14, 2006

Related U.S. Application Data

(60) Provisional application No. 60/688,846, filed on Jun. 8, 2005.

(51) Int. Cl.
*H01L 21/336* (2006.01)
(52) U.S. Cl. .................................. 438/260; 977/742
(58) Field of Classification Search .................. 438/142, 438/197, 238, 239, 257, 260, 381, 393; 977/721, 977/742
See application file for complete search history.

(56) References Cited

U.S. PATENT DOCUMENTS

| | | | |
|---|---|---|---|
| 4,979,149 A | 12/1990 | Popovic et al. |
| 6,057,637 A | 5/2000 | Zettl et al. |
| 6,100,109 A | 8/2000 | Melzner et al. |
| 6,128,214 A | 10/2000 | Kuekes et al. |
| 6,187,823 B1 | 2/2001 | Haddon |

(Continued)

FOREIGN PATENT DOCUMENTS

GB    2 364 933 A    2/2002

(Continued)

OTHER PUBLICATIONS

Avouris, Phaedon, "Carbon Nanotube Electronics," Chemical Physics 2002, 281:421-445.

(Continued)

*Primary Examiner* — Brook Kebede
(74) *Attorney, Agent, or Firm* — Wilmer Cutler Pickering Hale and Dorr LLP

(57) ABSTRACT

A method of forming a self-aligned logic cell. A nanotube layer is formed over the bottom electrode. A clamp layer is formed over the nanotube layer. The clamp layer covers the nanotube layer, thereby protecting the nanotube layer. A dielectric layer is formed over the clamp layer. The dielectric layer is etched. The clamp layer provides an etch stop and protects the nanotube layer. The clamp layer is etched with an isotropic etchant that etches the clamp layer underneath the dielectric layer, creating an overlap of the dielectric layer, and causing a self-alignment between the clamp layer and the dielectric layer. A spacer layer is formed over the nanotube layer. The spacer layer is etched except for a ring portion around the edge of the dielectric layer. The nanotube layer is etched except for portions that are underlying at least one of the clamp layer, the dielectric layer, and the spacer layer, thereby causing a self-alignment between the clamp layer, the overlap to the dielectric layer, the spacer layer, and the nanotube layer.

2 Claims, 6 Drawing Sheets

U.S. PATENT DOCUMENTS

| | | |
|---|---|---|
| 6,250,984 B1 | 6/2001 | Jin et al. |
| 6,256,767 B1 | 7/2001 | Kuekes et al. |
| 6,277,318 B1 | 8/2001 | Bower et al. |
| 6,314,019 B1 | 11/2001 | Kuekes et al. |
| 6,331,262 B1 | 12/2001 | Haddon |
| 6,342,276 B1 | 1/2002 | You et al. |
| 6,368,569 B1 | 4/2002 | Haddon |
| 6,409,567 B1 | 6/2002 | Amey, Jr. et al. |
| 6,423,583 B1 | 7/2002 | Avouris et al. |
| 6,426,687 B1 | 7/2002 | Osborn |
| 6,443,901 B1 | 9/2002 | Fraser |
| 6,445,006 B1 | 9/2002 | Brandes et al. |
| 6,495,116 B1 | 12/2002 | Herman |
| 6,495,258 B1 | 12/2002 | Chen et al. |
| 7,566,478 B2 | 1/2003 | Ward |
| 6,515,339 B2 | 2/2003 | Shin et al. |
| 6,528,020 B1 | 3/2003 | Dai et al. |
| 6,548,841 B2 | 4/2003 | Frazier et al. |
| 6,630,772 B1 | 10/2003 | Bower et al. |
| 6,645,628 B2 | 11/2003 | Shiffler, Jr. et al. |
| 6,707,098 B2 | 3/2004 | Hofmann et al. |
| 6,759,693 B2 | 7/2004 | Vogeli et al. |
| 6,803,840 B2 | 10/2004 | Hunt et al. |
| 6,808,746 B1 | 10/2004 | Dai et al. |
| 6,809,462 B2 | 10/2004 | Pelrine et al. |
| 6,809,465 B2 | 10/2004 | Jin |
| 6,833,558 B2 | 12/2004 | Lee et al. |
| 6,858,197 B1 | 2/2005 | Delzeit |
| 6,863,942 B2 | 3/2005 | Ren et al. |
| 6,896,864 B2 | 5/2005 | Clarke |
| 6,899,945 B2 | 5/2005 | Smalley et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 6,955,937 B1 | 10/2005 | Burke et al. |
| 6,969,651 B1* | 11/2005 | Lu et al. .................. 438/257 |
| 6,990,009 B2 | 1/2006 | Bertin et al. |
| 7,015,500 B2 | 3/2006 | Choi et al. |
| 7,057,402 B2 | 6/2006 | Cole et al. |
| 7,115,864 B2 | 10/2006 | Colbert |
| 7,115,901 B2 | 10/2006 | Bertin et al. |
| 7,115,960 B2 | 10/2006 | Bertin |
| 7,161,403 B2 | 1/2007 | Bertin |
| 2001/0004979 A1 | 6/2001 | Han et al. |
| 2001/0023986 A1 | 9/2001 | Mancevski |
| 2002/0081380 A1 | 6/2002 | Dillon |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0122111 A1 | 7/2003 | Glatkowski |
| 2003/0177929 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0238907 A1 | 12/2004 | Pinkerton et al. |
| 2004/0253167 A1 | 12/2004 | Silva et al. |
| 2004/0265550 A1 | 12/2004 | Glatkowski et al. |
| 2005/0053525 A1 | 3/2005 | Segal et al. |
| 2005/0056877 A1 | 3/2005 | Rueckes et al. |
| 2005/0065741 A1 | 3/2005 | Segal et al. |
| 2005/0068128 A1 | 3/2005 | Yip |
| 2005/0083635 A1* | 4/2005 | Ooma et al. ............... 361/305 |
| 2005/0095938 A1 | 5/2005 | Rosenberger et al. |
| 2006/0052509 A1 | 3/2006 | Saitoh |
| 2006/0183278 A1 | 8/2006 | Bertin et al. |
| 2006/0204427 A1 | 9/2006 | Ghenciu et al. |
| 2006/0237537 A1 | 10/2006 | Empedocles et al. |
| 2006/0237799 A1 | 10/2006 | Lu et al. |
| 2006/0258122 A1 | 11/2006 | Whitefield et al. |
| 2006/0278902 A1 | 12/2006 | Sun et al. |
| 2007/0003472 A1* | 1/2007 | Tolt .......................... 423/447.3 |
| 2007/0004191 A1 | 1/2007 | Gu et al. |

FOREIGN PATENT DOCUMENTS

| | | |
|---|---|---|
| JP | 2000203821 | 7/2000 |
| JP | 2001-035362 A2 | 2/2001 |
| JP | 2004-090208 A2 | 3/2004 |
| WO | WO-98/39250 A1 | 9/1998 |
| WO | WO-99/65821 A1 | 12/1999 |
| WO | WO-00/48195 | 8/2000 |
| WO | WO-01/03208 A1 | 1/2001 |
| WO | WO-03/034142 | 10/2001 |
| WO | WO-02/48701 A2 | 6/2002 |
| WO | WO-03/016901 A1 | 2/2003 |

OTHER PUBLICATIONS

Bachtold, A., et al, "Logic Circuits Based on Carbon Nanotubes," Physical (2003) pp. 42-46.

Chen, J., et al, "Self-aligned Carbon Nanotube Transistors with Charge Transfer Doping," Applied Physics Letters (2005) 86:123108-1-3.

Chen, J., et al, "Self-aligned Carbon Nanotube Transistors with Novel Chemicsl Doping," IEDM (2004) 04:695-698.

Derycke, V., "Controlling Doping and Carrier Injection in Carbon NanotubeTransistors", Applied Physics Letters, 2002. 80 (15) 2773-2775.

Derycke, V., et al., "Carbon Nanotube Inter- and Intramolecular Logic Gates", Nano Letters, 2001. 1 (9) 453-456.

Duan, X., et al, "Nonvolatile Memory and Programmable Logic from Molecule-Gated Nanowires," Nano Letters, (2002) vol. 0, No. 0, A-D, 3.4A-D.

Heinze, S., "Carbon Nanotubes as Schottky Barrier Transistors" Physical Review Letters, 2002. 89 (10) 106801-1-106801-4.

Huang, Y., et al, "Logic Gates and Computation from Assembled Nanowire Building Blocks," Science (2001) 294(9):1313-1317.

Javey, A., et al, "Carbon Nanotube Field-Effect Transistors with Integrated Ohmic Contacts and High-κ Gate Dielectrics," Nano Letters (2004) 4(3): 447-450.

Javey, A., et al, "Carbon Nanotube Transistor Arrays for Multistage Complementary Logic and Ring Oscillators," Nano Letters, (2002) vol. 0, No. 0 - A-D.

Javey, A., et al, "High-κ Dielectrics for Advanced Carbon-Nanotube Transistors and Logic Gates," Nature Materials (2002) 1:241-246.

Martel, R., et al, "Carbon Nanotube Field-Effect Transistors and Logic Circuits," DAC 2002, Jun. 10-12, 2002, vol. 7.4, pp. 94-98.

Radosavljevic, M. et al., "Nonvolatile Molecular Memory Elements Based on Ambipolar Nanotube Field Effect Transistors", Nano Letters, 2002. 2 (7) 761-764.

Rueckes, T. et al., "Carbon Nanotube—Based Nonvolatile Random Access Memory for Molecular Computing", Science, 2000. 289, 94-97.

Wind, S., et al, "Fabrication and Electrical Characterization of Top Gate Single-Wall Carbon Nanotube Field-Effect Transistors," IBM T.J. Watson Research Center, 6A1:1-9 plus figures 1-5.

Wind, S., et al, "Vertical Scaling of Carbon Nanotube Field-Effect Transistors Using Top Gate Electrodes," Applied Physics Letters (2002), 80(20):3817-3819.

Kinaret, J.M., et al., "A Carbon-nanotube-based nanorelay," Applied Physics Letter, vol. 82, No. 8, Feb. 24, 2003, pp. 1287-1289.

Ajayan, P. M. et al., "Applications of Carbon Nanotubes", Carbon Nanotubes, vol. 80, pp. 391-425, 2001.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Bradley, K. et al., "Flexible Nanotube Electronics," *Nano Letters*, vol. 3, No. 10, pp. 1353-1355, 2003.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotube Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Architectures, Physics, and Devices", J. Phys. Chem. B, vol. 103, pp. 1126-11255, 1999.

Dequesnes, M. et al., "Calculation of pull-in voltages for carbon-nanotube-based nanoelectromechanical switches," *Nanotechnology*, Jan. 22, 2002, vol. 13, pp. 383-386.

Desai et al., "Freestanding Carbon Nanotube Specific Fabrication", *Proc. of 2005, 5th IEEE Conf., Nanotech*, Nagoya, Japan, pp. 1-4, Jul. 2005.

Franklin, N. R. et al., "An Enhanced CVD Approach to Extensive Nanotube Networks with Directionality", Advanced Materials, 5 pages, 2000.

Hafner, J. H. et al., "Catalytic growth of single-wall carbon nanotubes from metal particles", Chemical Physics Letters, vol. 296, pp. 195-202, Oct. 30, 1998.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-91, 2002.

Joselevich, E., "Vectorial Growth of Metallic and Semiconducting Single-Wall Carbon Nanotubes", Nano Letters, vol. 0, No. 0, A-E, 2002.

Kaneto et al., "Electrical conductivities of multi-wall carbon nano tubes", *Synthethic Materials*, Elsevier Science, SA., vol. 203, pp. 2543-2546, 1999.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13. pp. 1008-1014, 2001.

Nerushev, O. A., et al., "Carbon nanotube films obtained by thermal chemical vapor deposition", J. Mater. Chem., vol. 11, pp. 1122-1132, 2001.

Onoa, G.B. et al., "Bulk production of singly dispersed carbon nanotubes with prescribed lengths," Nanotechnology, vol. 16, pp. 2799-2803, 2005.

Parikh, K. et al., "Flexible vapor sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Sotiropoulou, S. et al., "Carbon nanotube array-based biosensor", Anal. Bioanal. Chem, vol. 375, pp. 103-105, 2003.

Stadermann, M. et al., "Nanoscale study of conduction through carbon nanotube networks," *Phys. Rev. B 69*, 201402(R), 2004.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Zhang et al., "Formation of metal nanowires on suspended single-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes', Physical Review B., vol. 64, pp. 201402-1 to 201402-4, 2001.

Ago et al., "Work Function of Purified and Oxidised Carbon Nanotubes," Synthetic Metals, vol. 103, pp. 2494-2495 (1999).

Banerjee et al., "Functionalization of Carbon Nanotubes with a Metal-Containing Molecular Complex," Nano Letters, vol. 2, No. 1, pp. 49-53 (2002).

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Delzeit et al., "Multilayered Metal Catalysts for Controlling the Density of Single-Walled Carbon Nanotubes Growth," Chemical Physics Letters, vol. 348, pp. 368-374, Nov. 16, 2001.

Haddon et al., "Purification and Separation of Carbon Nanotubes," MRS Bulletin, pp. 252-259, Apr. 2004.

International Search Report for PCT/U2005/045316, Sep. 6, 2006, 2 pages.

International Search Report and Written Opinion for International Patent Application No. PCT/US05/18467, Oct. 1, 2007.

International Search Report, International Patent Application No. PCT/US05/18539, Sep. 18, 2006, 4 pages.

Jeong et al., "A New Purification Method of Single-Wall Carbon Nanotubes Using H2S and O2 Mixture Gas," chemical Physics Letters, vol. 344, pp. 18-22, Aug. 17, 2001.

Kahn, Michael et al., Solubilization of Oxidized Single-Walled Carbon Nanotubes in Organic and Aqueous Solvents through Organic Derivatization, Nano Letters, vol. 2, No. 11, 2002, 4 pages.

Shelimov, Konstanti B., et al., "Purification of Single-Wall Carbon Nanotubes by Ultrasonically Assisted Filtration," Chemical Physics Letters, Jan. 23, 1998, 6 pages.

Lin, Yu-Ming et al., Novel Carbon Nanotube FET Design with Tunable Polarity, IEEE 2004, 4 pages.

Niu, Chunming, et al., "High Power Electrochemical Capacitors Based on Carbon Nanobute Electrodes," Appl. Phys. Lett. 70(11), Mar. 17, 1997, 3 pages.

* cited by examiner

SELF-ALIGNED CELL INTEGRATION SCHEME

This application claims priority on provisional patent application 60/688,846, filed Jun. 8, 2005.

FIELD

This invention relates to the field of integrated circuit fabrication. More particularly, this invention relates to forming switching structures within integrated circuits.

BACKGROUND

Carbon nanotube technology is quickly becoming a technological area that is making an impact on the field of microelectronic devices. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Single-wall carbon nanotubes are quasi one-dimensional nanowires, which exhibit either metallic or semiconducting properties, depending upon their chirality and radius. Single-wall nanotubes have been demonstrated as both semiconducting layers in thin film transistors as well as metallic interconnects between metal layers.

One technology uses carbon nanotubes as an electromechanical switch for non-volatile memory devices, where the nanotubes are spin-deposited over a patterned substrate surface. The nanotubes 12 lay over trenches 14 between a first electrode 16 and a second electrode 18 of an integrated circuit 10, as depicted in FIG. 1. The device 20 is switched on by applying a bias to the second electrode 18, and switched off by removing the bias to the second electrode 18, and applying a bias to the first electrode 16.

A two-terminal switching device 20 can be made by overlapping a metal layer over a nanotube layer 12, as depicted in FIG. 2, where the metal layer is segmented into a first electrode 16 and a second electrode 18.

Current integration schemes for the two-terminal cell 20 consist of patterning the nanotube layer 12 followed by alignment of the second or programming electrode 18 to overlap the nanotube layer 12 ends by a discrete distance, such as from about twenty-five nanometers to about seventy-five nanometers. The accuracy of the alignment is generally limited by the tolerances of the photolithography tool used, suggesting that electron beam or very short wavelength scanners are preferred to achieve the desired overlap.

What is needed, therefore, are alternate methods for the fabrication of nanotube structures that reduce the dependence of the process on critical alignment tools.

SUMMARY

The above and other needs are met by a method of forming a self-aligned logic cell by forming an electrically conductive bottom electrode. A carbon nanotube layer is formed over the bottom electrode with electrical continuity with the bottom electrode. An electrically conductive clamp layer is formed over the nanotube layer with electrical continuity with the nanotube layer. The clamp layer substantially completely covers the nanotube layer, thereby protecting the nanotube layer. An electrically nonconductive dielectric layer is formed over the clamp layer. The dielectric layer is etched with a first etchant that does not substantially etch the clamp layer. The clamp layer provides an etch stop to the first etchant and protects the nanotube layer from the first etchant. A remainder of the dielectric layer is left overlying the bottom electrode.

The clamp layer is etched with an isotropic second etchant that does not substantially etch the dielectric layer and the nanotube layer, and which etches the clamp layer underneath a peripheral edge of the dielectric layer to a substantially uniform and desired degree, thereby creating an overlap of the dielectric layer, and causing a self-alignment between the clamp layer and the overlap of the dielectric layer. An electrically conductive spacer layer is formed over at least the nanotube layer that does not substantially underlie the dielectric layer, the spacer layer having electrical continuity with the nanotube layer. The spacer layer is etched to remove all of the spacer layer except a ring portion circumferentially disposed around the peripheral edge of the dielectric layer and overlying a portion of the nanotube layer. The nanotube layer is etched to remove all of the nanotube layer except those portions of the nanotube layer that are underlying at least one of the clamp layer, the dielectric layer, and the spacer layer, thereby causing a self-alignment between the clamp layer, the overlap to the dielectric layer, the spacer layer, and the nanotube layer.

Because of the method in which the cell is formed, the critical elements of the cell, such as the spacing of the carbon nanotube layer between the electrically conductive electrodes, are self-aligned, thereby reducing alignment errors that might otherwise occur in the fabrication of the cell, that would tend to reduce cell performance and reliability.

According to another aspect of the invention there is described a method of forming a self-aligned logic cell by forming an electrically conductive bottom electrode, and forming a carbon nanotube layer over the bottom electrode with electrical continuity with the bottom electrode. An electrically conductive clamp layer is formed over the nanotube layer with electrical continuity with the nanotube layer, where the clamp layer substantially completely covers the nanotube layer, thereby protecting the nanotube layer. An electrically nonconductive dielectric layer is formed over the clamp layer. The dielectric layer, the clamp layer, and the nanotube layer are etched with a first etchant to produce a stack of the dielectric layer, the clamp layer, and the nanotube layer remaining over the bottom electrode. Each of the dielectric layer, the clamp layer, and the nanotube layer have substantially equal size after the etch. The dielectric layer is etched with a second etchant that does not substantially etch the clamp layer and the nanotube layer, to reduce the size of the dielectric layer and leave a ring portion of the clamp layer exposed around a peripheral edge of the dielectric layer. The clamp layer is etched with an isotropic third etchant that does not substantially etch the dielectric layer and the nanotube layer, and which etches the clamp layer underneath the peripheral edge of the dielectric layer to a substantially uniform and desired degree, thereby creating an overlap of the dielectric layer, and causing a self-alignment between the clamp layer, the overlap of the dielectric layer, and the nanotube layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

By employing a self-aligned method as described herein, the effect of the tolerance of the photolithography tool is dramatically reduced and preferably eliminated. The following embodiments describe two examples of self-alignment methods that create the desired overlap.

Embodiment 1

Figure 1:
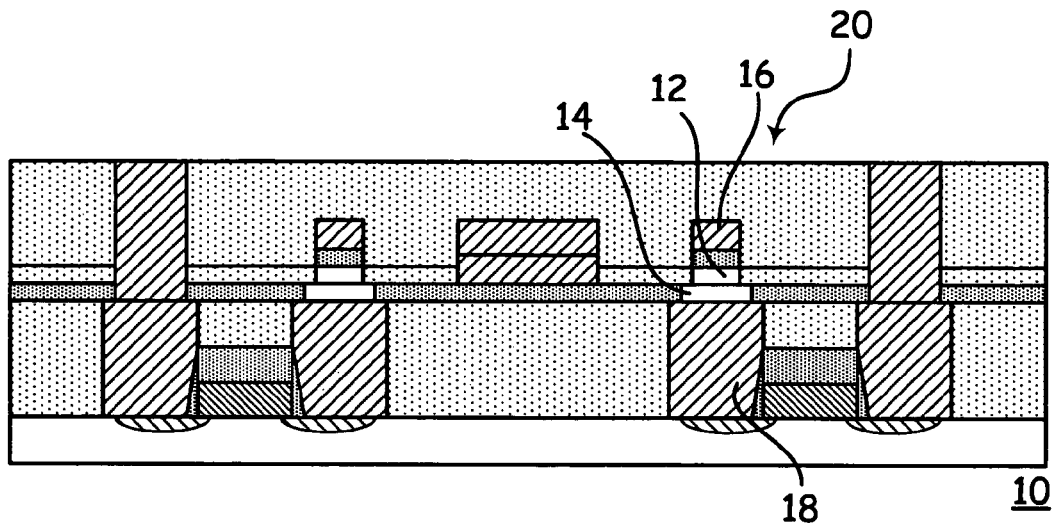
FIG. 1 is a cross sectional depiction of a first prior art nanotube structure.
Figure 2:
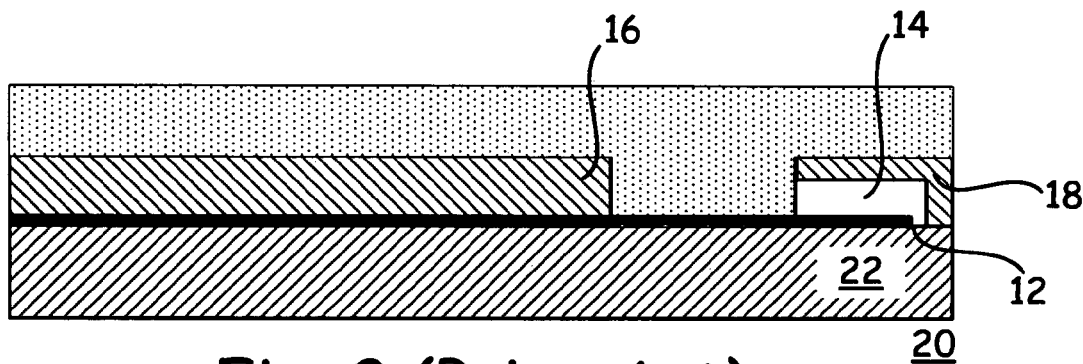
FIG. 2 is a cross sectional depiction of a second prior art nanotube structure.
Figure 3:
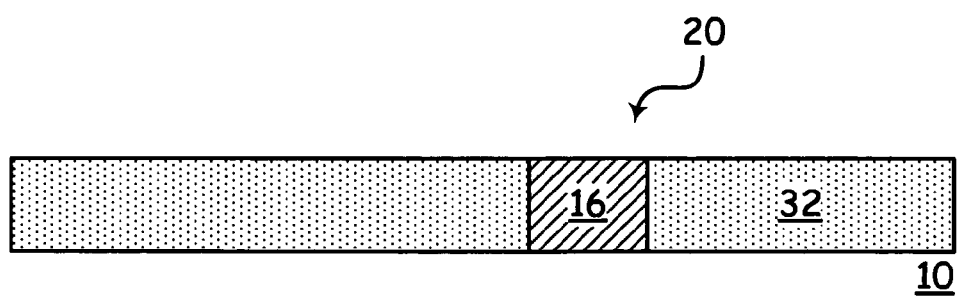
FIG. 3 is a cross sectional depiction of a first electrode according to a first preferred embodiment of a method according to the present invention.

As depicted in FIG. 3, an interlayer dielectric layer 32 is formed with a first or contact electrode 16. The first electrode can be formed of any conductive material, including one or more of doped polysilicon, contact metal such as W, or via material such as Al, Cu, TiN, and TaN.

Figure 4:
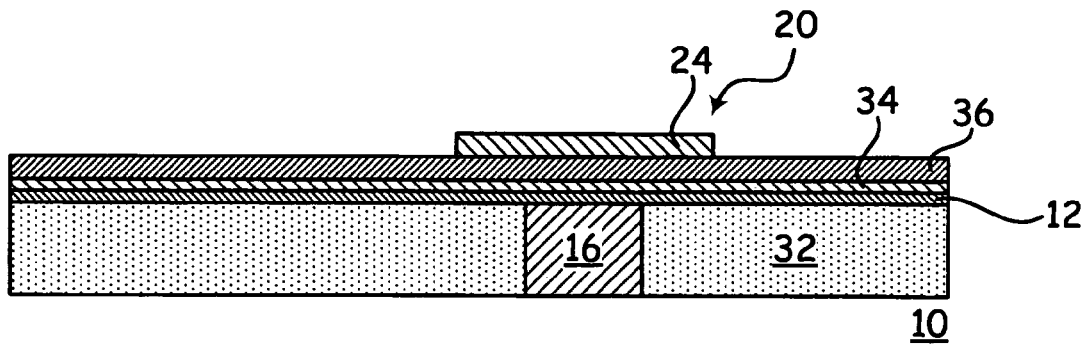
FIG. 4 is a cross sectional depiction of a nanotube layer, metal layer, and dielectric layer overlaid with photoresist according to a first preferred embodiment of the method according to the present invention.
Figure 5:
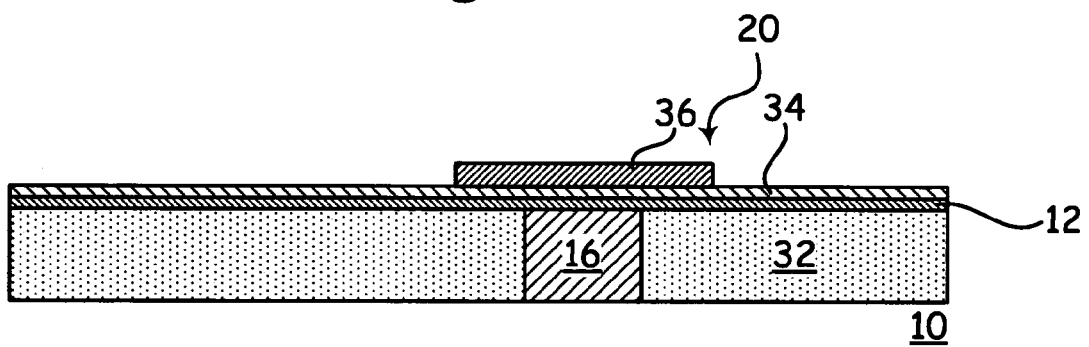
FIG. 5 is a cross sectional depiction of a patterned dielectric layer according to a first preferred embodiment of the method according to the present invention.

As depicted in FIG. 4, the nanotube layer 12 is formed overlying the interlayer dielectric layer 32, and a metal layer 34 is next formed, where the metal layer 34 can be one or more of any conductive material such as Co, TiN, and Al, and a dielectric layer 36 is then deposited, such as one or more of an oxide or a nitride. Photoresist 20 is then applied and patterned. FIG. 5 depicts the structure after the dielectric layer 36 has been etched, and the photoresist 24 has been stripped and cleaned.

Figure 6:
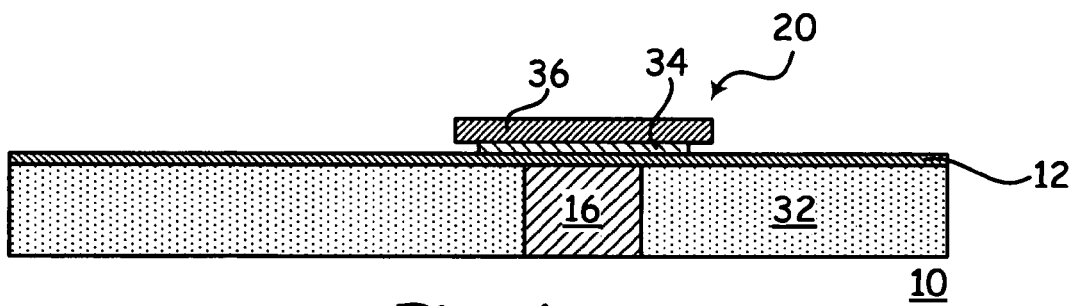
FIG. 6 is a cross sectional depiction of an etched metal layer that undercuts the dielectric layer according to a first preferred embodiment of the method according to the present invention.
Figure 7:
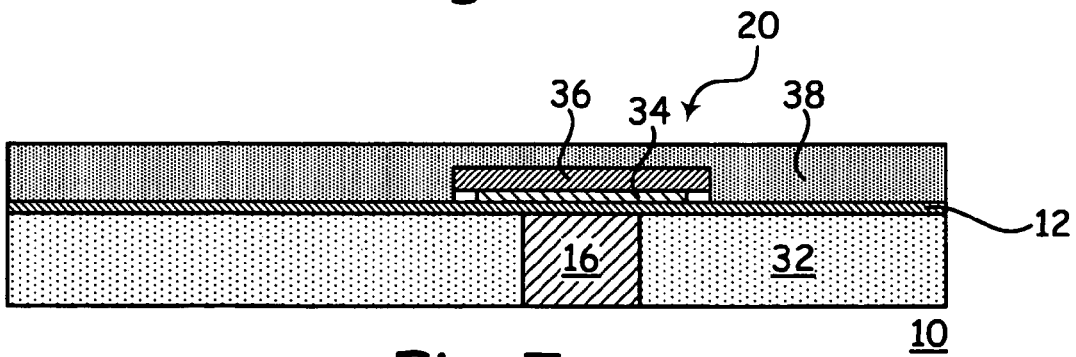
FIG. 7 is a cross sectional depiction of a spacer metal layer according to a first preferred embodiment of the method according to the present invention.
Figure 8:
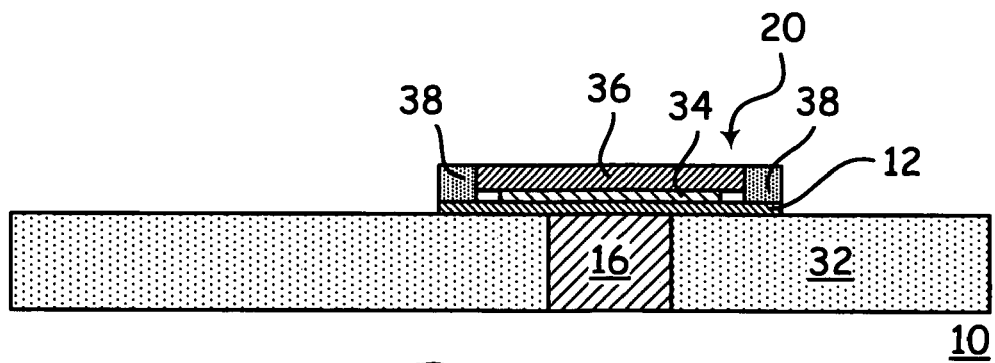
FIG. 8 is a cross sectional depiction of a patterned spacer metal layer according to a first preferred embodiment of the method according to the present invention.

As depicted in FIG. 6, a non-plasma isotropic etch of metal layer 34 is then performed, such as with a solution of $NH_4OH$: $H_2O_2$:$H_2O$. As a plasma would tend to damage the nanotube layer 12, it is important that this etch step be performed without a plasma. A spacer metal layer 38 is then deposited, preferably formed of one or more materials such as TiN, Co, TaN, and Al, as depicted in FIG. 7. The spacer metal layer 38 and the nanotube layer 12 are then etched to produce the structure such as depicted in FIG. 8. The etch is preferably performed such as with a wet chemical etch or an oxygen plasma. The plasma etch is acceptable at this point, because the remaining nanotube layer 12 is protected from the etch process.

Figure 9:
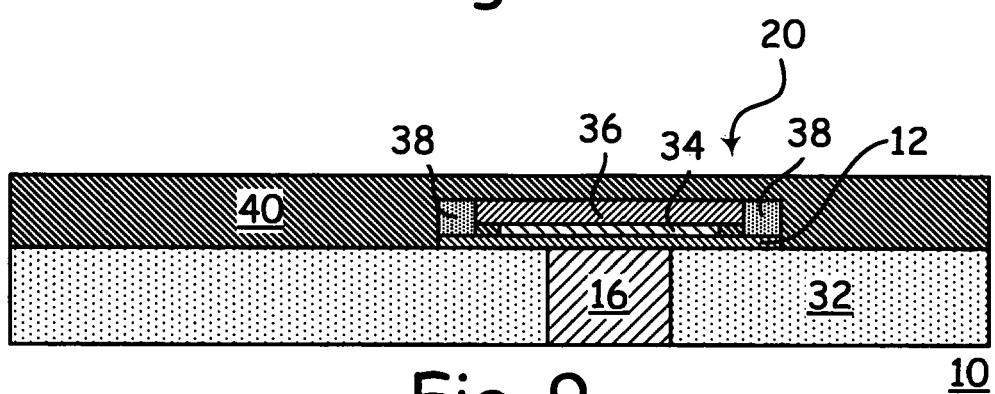
FIG. 9 is a cross sectional depiction of a pad metal layer according to a first preferred embodiment of the method according to the present invention.
Figure 10:
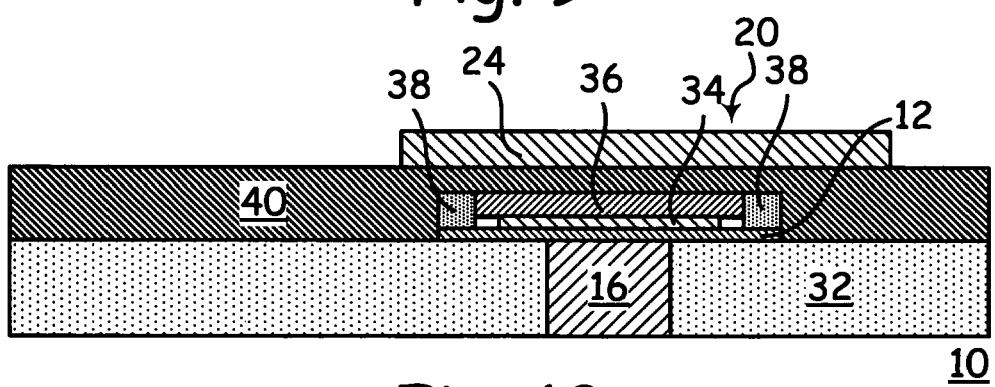
FIG. 10 is a cross sectional depiction of the pad metal layer patterned with photoresist according to a first preferred embodiment of the method according to the present invention.
Figure 11:
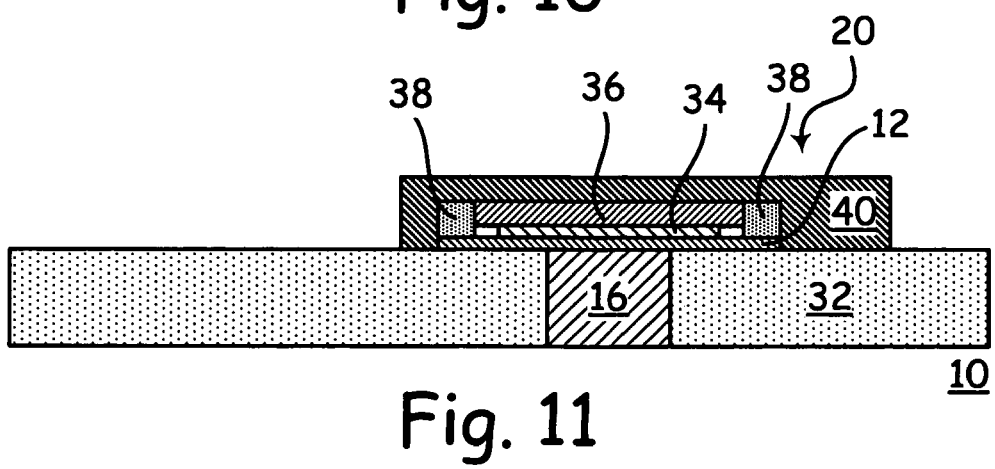
FIG. 11 is a cross sectional depiction of the patterned pad metal layer according to a first preferred embodiment of the method according to the present invention.
Figure 12:
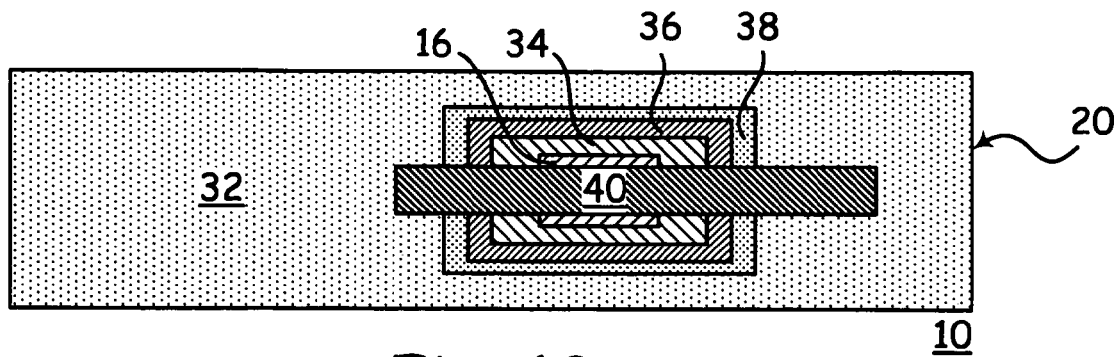
FIG. 12 is a top plan depiction of a completed cell according to a first preferred embodiment of the method according to the present invention.
Figure 13:
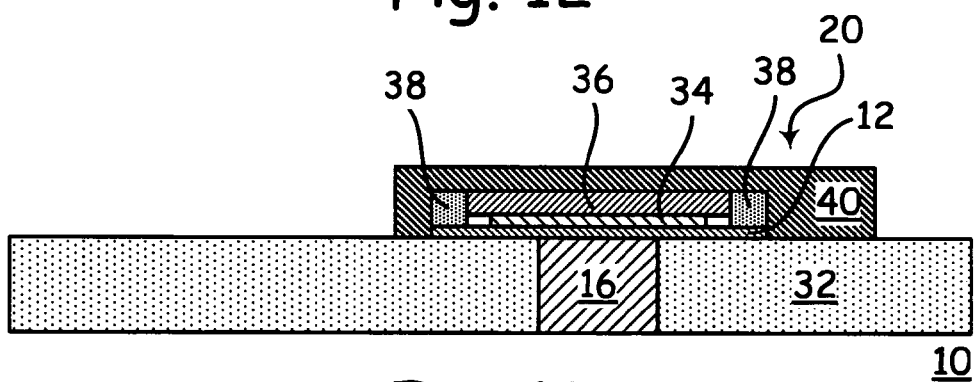
FIG. 13 is a cross sectional depiction of the completed cell according to a first preferred embodiment of the method according to the present invention.

Next, a pad metal layer 40 is deposited, such as of at least one of Al and TiN, and optionally planarized, such as with a chemical mechanical planarization, as depicted in FIG. 9. The pad metal layer 40 is patterned with photoresist 24 as depicted in FIG. 10, and etched and cleaned as depicted in FIG. 11. The final cell structure 20 is depicted from a top view in FIG. 12 and a cross-sectional view in FIG. 13.

The cell 20 operates by applying a program voltage pulse between the bottom electrode 16 and the top electrode 40, which causes the nanotube layer 12 to "heal" any voltage-induced cracks and become conductive between the bottom electrode 16 and the top electrode 40, for an "on-state" condition. An erase voltage pulse is applied between the bottom electrode 16 and the top electrode 40, which causes the nanotube layer 12 to sever and become nonconductive between the bottom electrode 16 and the top electrode 40, for an "off-state" condition. Thus, the erase pulse causes physical bond breaking of the nanotubes 12, while a program pulse creates an electrostatic attraction between the severed ends of the nanotubes 12, thereby bringing them back in contact.

Embodiment 2

Figure 14:
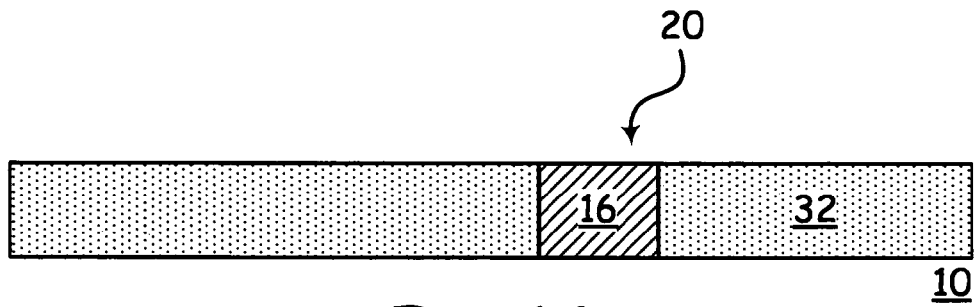
FIG. 14 is a cross sectional depiction of a first electrode according to a second preferred embodiment of a method according to the present invention.

As depicted in FIG. 14, an interlayer dielectric layer 32 is formed with a first or contact electrode 16. The first electrode can be formed of any conductive material, including one or more of doped polysilicon, contact metal such as W, or via material such as Al, Cu, TiN, and TaN.

Figure 15:
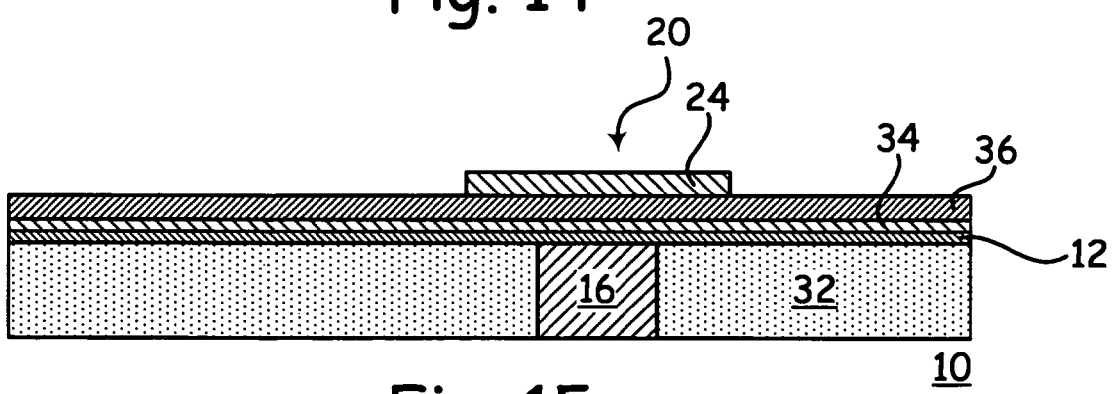
FIG. 15 is a cross sectional depiction of a nanotube layer, metal layer, and dielectric layer overlaid with photoresist according to a second preferred embodiment of the method according to the present invention.
Figure 16:
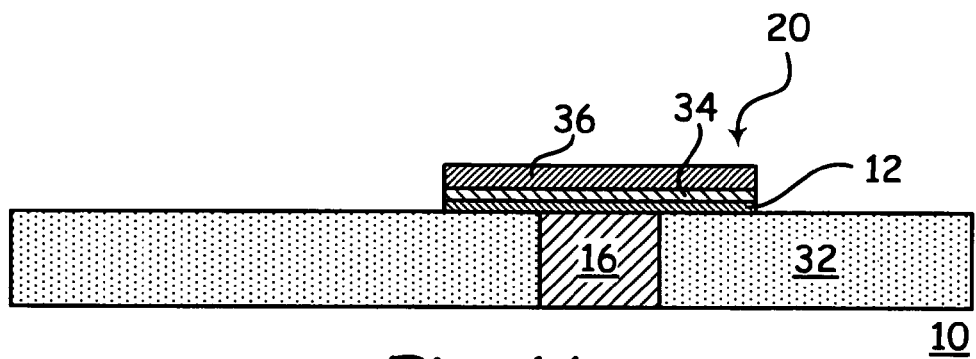
FIG. 16 is a cross sectional depiction of a patterned nanotube layer, metal layer, and dielectric layer according to a second preferred embodiment of the method according to the present invention.

As depicted in FIG. 15, the nanotube layer 12 is formed overlying the interlayer dielectric layer 32, and a metal layer 34 is next formed, where the metal layer 34 can be any conductive material such as one or more of Co, TiN, and Al, and a dielectric layer 36 is then deposited, such as one or more of an oxide or a nitride. Photoresist 20 is then applied and patterned. FIG. 16 depicts the structure after the dielectric layer 36, metal layer 34, and the nanotube layer 12 have all been etched, and the photoresist 24 has been stripped and cleaned. As the nanotube layer 12 is protected by the overlying layers, this etch can be either a wet or plasma etch.

Figure 17:
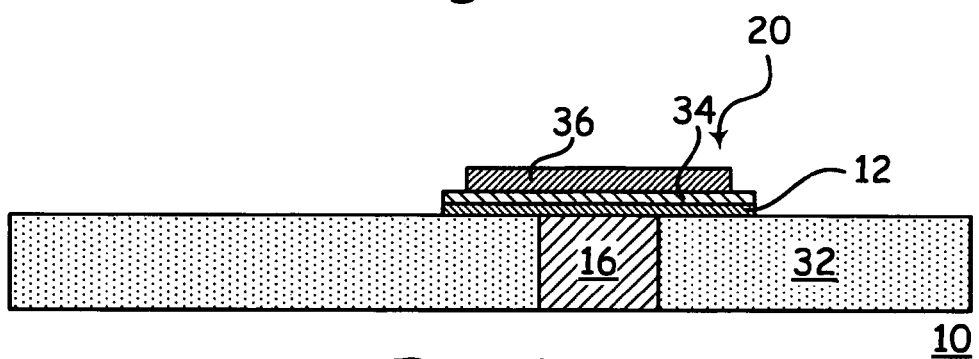
FIG. 17 is a cross sectional depiction of an etched back dielectric layer according to a second preferred embodiment of the method according to the present invention.
Figure 18:
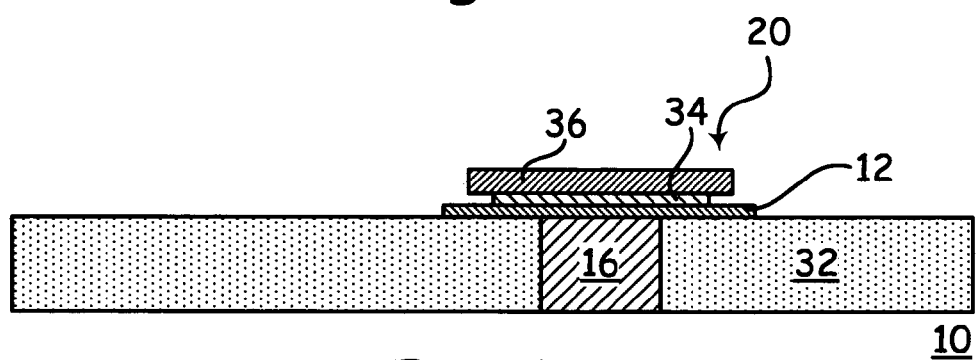
FIG. 18 is a cross sectional depiction of an etched metal layer that undercuts the dielectric layer according to a second preferred embodiment of the method according to the present invention.

The dielectric layer 36 is then reduced such as with a wet isotropic etch of $HF:H_2O$, as depicted in FIG. 17. A non-plasma isotropic etch is then performed on the metal layer 34, such as with a solution of $NH_4OH:H_2O_2:H_2O$, as depicted in FIG. 18, so as to not expose the nanotube layer 12 to a plasma.

Figure 19:
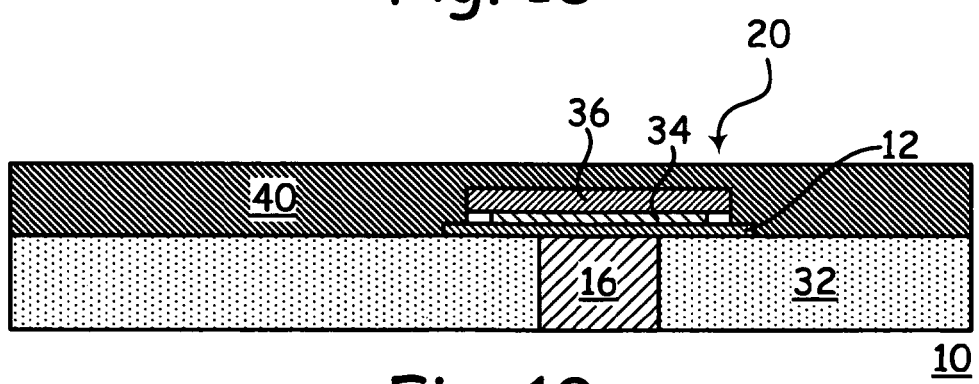
FIG. 19 is a cross sectional depiction of a combination spacer and pad metal layer according to a second preferred embodiment of the method according to the present invention.
Figure 20:
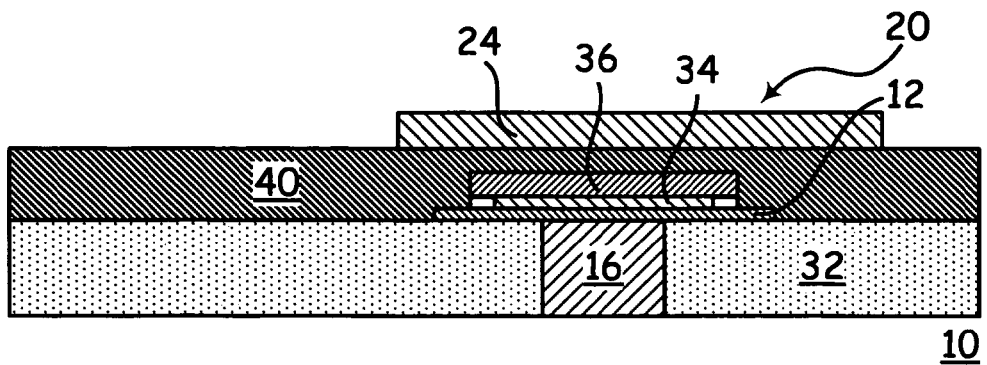
FIG. 20 is a cross sectional depiction of the combination spacer and pad metal layer patterned with photoresist according to a second preferred embodiment of the method according to the present invention.
Figure 21:
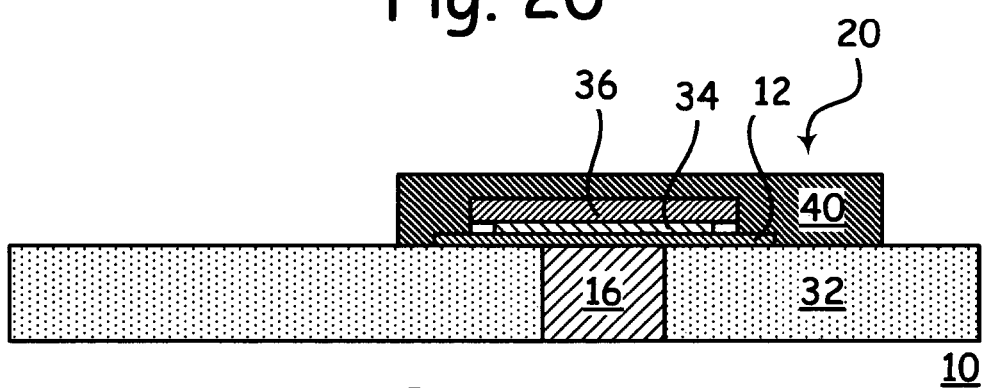
FIG. 21 is a cross sectional depiction of the patterned combination spacer and pad metal layer according to a second preferred embodiment of the method according to the present invention.
Figure 22:
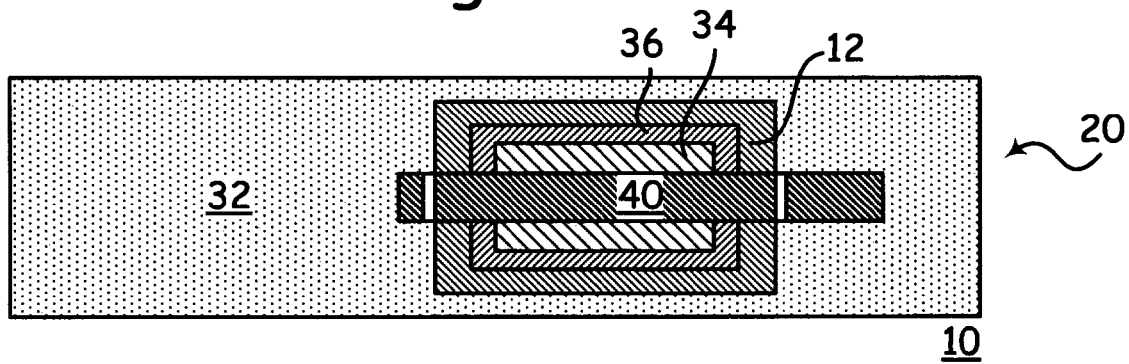
FIG. 22 is a top plan depiction of a completed cell according to a second preferred embodiment of the method according to the present invention.
Figure 23:
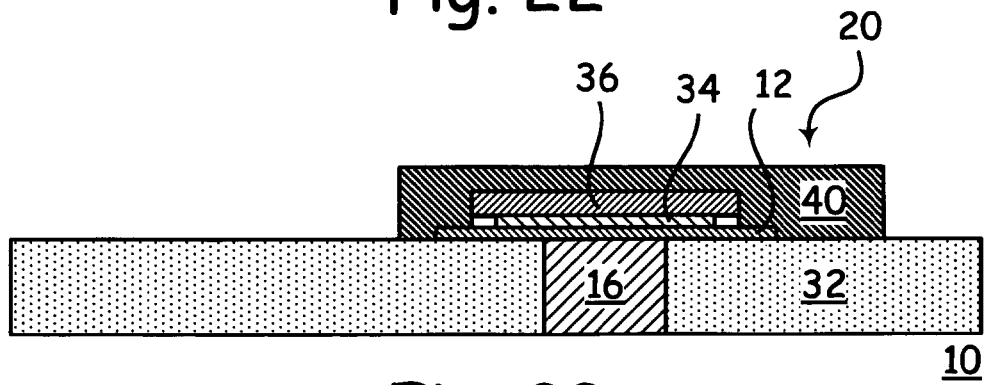
FIG. 23 is a cross sectional depiction of the completed cell according to a second preferred embodiment of the method according to the present invention.

A combination spacer metal layer and pad metal layer 40 is then deposited as a single layer, formed of a material such as one or more of Al and TiN, as depicted in FIG. 19. A post deposition planarization, such as a chemical mechanical planarization, is optionally performed. The combination spacer metal layer and pad metal layer 40 is patterned with photoresist 24 as depicted in FIG. 20, and etched and cleaned as depicted in FIG. 21. The final cell structure 20 is depicted from a top view in FIG. 22 and a cross-sectional view in FIG. 23.

Advantages

These embodiments describe a self-aligned process that produces a small, controlled overlap of the program metal with the exposed ends of the nanotube layer 12, and produces a self-passivating nanotube layer 12. The size of the cell 20 produced is scalable to any technology node, with the scaling dimensions of the cell 20 being proportional to the size of the underlying contact electrode. The formation of the sealed cavity 14 separates the program electrode and the contact electrode without exposing the nanotube layer 12 to a plasma, which would be detrimental to it. The methods provide independent control of the spacing between the two electrodes and overlap of the nanotube layer 12. The electrode spacing is independent of the alignment to the contact electrode. These methods can be integrated to the process flow between any of the existing metal layers in the fabrication process of the integrated circuit. Further, the processes can be extended vertically to have multiple layers of the memory elements between each metal layer. Only two masking steps are required to build the cells 20.

Alternate Embodiments

In the first embodiment above, an inter-metallic dielectric layer wet etch can be used to undercut the ends of the nanotube layer 12 after the metal spacer 34 etch, thereby creating a cavity, which is then enclosed during the pad metal 40 deposition. Also in embodiment one, the spacer electrode 34 can be selectively removed by wet or isotropic dry etch to limit the program electrode area to the pad electrode 40. In both of the two embodiments, the pad electrode 40 can be formed using a damascene scheme instead of the subtractive schemes described above.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a self-aligned logic cell, the method comprising the sequential steps of:
    forming an electrically conductive bottom electrode,
    forming a carbon nanotube layer over the bottom electrode and having electrical continuity with the bottom electrode,
    forming an electrically conductive clamp layer over the nanotube layer and having electrical continuity with the nanotube layer, where the clamp layer substantially completely covers the nanotube layer, thereby protecting the nanotube layer,
    forming an electrically nonconductive dielectric layer over the clamp layer,
    etching the dielectric layer with a first etchant that does not substantially etch the clamp layer, where the clamp layer provides an etch stop to the first etchant and protects the nanotube layer from the first etchant, leaving a remainder of the dielectric layer overlying the bottom electrode,
    etching the clamp layer with an isotropic second etchant that does not substantially etch the dielectric layer and the nanotube layer, and which etches the clamp layer underneath a peripheral edge of the dielectric layer to a substantially uniform and desired degree, thereby creating an overlap of the dielectric layer, and causing a self-alignment between the clamp layer and the overlap of the dielectric layer,
    forming an electrically conductive spacer layer over at least the nanotube layer that does not substantially underlie the dielectric layer, the spacer layer having electrical continuity with the nanotube layer,
    etching the spacer layer to remove all of the spacer layer except a ring portion circumferentially disposed around the peripheral edge of the dielectric layer and overlying a portion of the nanotube layer, and
    etching the nanotube layer to remove all of the nanotube layer except those portions of the nanotube layer that are underlying at least one of the clamp layer, the dielectric layer, and the spacer layer, thereby causing a self-alignment between the clamp layer, the overlap to the dielectric layer, the spacer layer, and the nanotube layer.

2. A method of forming a self-aligned logic cell, the method comprising the sequential steps of:
    forming an electrically conductive bottom electrode, forming a carbon nanotube layer over the bottom electrode and having electrical continuity with the bottom electrode, forming an electrically conductive clamp layer over the nanotube layer and having electrical continuity with the nanotube layer, where the clamp layer substantially completely covers the nanotube layer, thereby protecting the nanotube layer, forming an electrically nonconductive dielectric layer over the clamp layer, etching the dielectric layer, the clamp layer, and the nanotube layer with a first etchant to produce a stack of the dielectric layer, the clamp layer, and the nanotube layer remaining over the bottom electrode, where each of the dielectric layer, the clamp layer, and the nanotube layer have substantially equal size after the etch, etching the dielectric layer with a second etchant that does not substantially etch the clamp layer and the nanotube layer to reduce the size of the dielectric layer and leave a ring portion of the clamp layer exposed around a peripheral edge of the dielectric layer, and etching the clamp layer with an isotropic third etchant that does not substantially etch the dielectric layer and the nanotube layer, and which etches the clamp layer underneath the peripheral edge of the dielectric layer to a substantially uniform and desired degree, thereby creating an overlap of the dielectric layer, and causing a self-alignment between the clamp layer, the overlap of the dielectric layer, and the nanotube layer.

* * * * *